(12) United States Patent
Nemoz et al.

(10) Patent No.: US 8,542,485 B2
(45) Date of Patent: Sep. 24, 2013

(54) ELECTRONIC EQUIPMENT HOUSING COOLED BY NATURAL AND FORCED VENTILATION

(75) Inventors: Gerard Nemoz, Maisons Alfort (FR);
Bruno Bellin, Verrieres le Buisson (FR);
Pilippe Bieth, Saclay (FR)

(73) Assignee: Thales, Neuilly sur Seine (FR)

( * ) Notice: Subject to any disclaimer, the term of this patent is extended or adjusted under 35 U.S.C. 154(b) by 912 days.

(21) Appl. No.: 12/519,639

(22) PCT Filed: Dec. 11, 2007

(86) PCT No.: PCT/EP2007/063700
§ 371 (c)(1),
(2), (4) Date: Jun. 17, 2009

(87) PCT Pub. No.: WO2008/080776
PCT Pub. Date: Jul. 10, 2008

(65) Prior Publication Data
US 2009/0318071 A1 Dec. 24, 2009

(30) Foreign Application Priority Data
Dec. 21, 2006 (FR) ..................................... 06 11209

(51) Int. Cl.
*H05K 7/20* (2006.01)
(52) U.S. Cl.
USPC ............................ 361/690; 361/727; 454/184
(58) Field of Classification Search
USPC ................. 454/184; 361/688–690, 694–695,
361/700, 715; 165/90.2, 80.3, 122, 123,
165/127, 129, 131
See application file for complete search history.

(56) References Cited

U.S. PATENT DOCUMENTS 5,943,211 A * 8/1999 Havey et al. .................. 361/699
6,262,891 B1 * 7/2001 Wickelmaier et al. ........ 361/695
(Continued)

FOREIGN PATENT DOCUMENTS

EP 1175136 A 1/2002
FR 2812378 A1 * 2/2002
(Continued)

OTHER PUBLICATIONS

U.S. Appl. No. 11/722,319, filed Nov. 14, 2005 Not Yet Published (Inventor: Gerard Nemoz).
(Continued)

*Primary Examiner* — Steven B McAllister
*Assistant Examiner* — Jamil Decker
(74) *Attorney, Agent, or Firm* — Lowe Hauptman & Ham, LLP

(57) ABSTRACT

This housing comprises rackable electronic equipment modules (2) housed in a bay. A module (2) has both internal (12, 13) and external (45) thermal radiators cooled by natural and forced ventilation. The internal thermal radiators (12, 13) are placed in thermal contact with the hot spots of the electronic equipment placed in the module (2) via hear collectors (40, 41) connected by heat pipe (42, 43) to the external thermal radiators (45) arranged outside on the edge (44) of the module (2). The internal thermal radiators (12, 13) are sized to be sufficient to cool the electric equipment when the forced ventilation is functioning normally. The external thermal radiators (45) are sized to complement the cooling provided by the internal radiators (12, 13) should the forced ventilation be lost.

11 Claims, 3 Drawing Sheets

(56) References Cited

U.S. PATENT DOCUMENTS

| | | | |
|---|---|---|---|
| 6,377,453 B1* | 4/2002 | Belady | 361/679.47 |
| 6,510,053 B1* | 1/2003 | Azar | 361/704 |
| 6,778,394 B2* | 8/2004 | Oikawa et al. | 361/700 |
| 6,804,117 B2* | 10/2004 | Phillips et al. | 361/700 |
| 6,850,415 B2* | 2/2005 | Dimarco | 361/752 |
| 7,130,193 B2* | 10/2006 | Hirafuji et al. | 361/700 |
| 7,152,418 B2* | 12/2006 | Alappat et al. | 62/186 |
| 7,183,500 B2* | 2/2007 | Campini et al. | 174/392 |
| 7,369,412 B2* | 5/2008 | Peng et al. | 361/715 |
| 7,457,118 B1* | 11/2008 | French et al. | 361/700 |
| 7,460,367 B2* | 12/2008 | Tracewell et al. | 361/679.48 |
| 7,859,837 B2* | 12/2010 | Nemoz et al. | 361/690 |
| 7,869,209 B2* | 1/2011 | Nemoz et al. | 361/690 |
| 8,064,200 B1* | 11/2011 | West et al. | 361/695 |
| 2004/0252456 A1* | 12/2004 | Larson et al. | 361/694 |
| 2005/0193742 A1* | 9/2005 | Arnold | 62/3.5 |
| 2007/0042514 A1* | 2/2007 | Wu et al. | 438/17 |
| 2007/0086158 A1 | 4/2007 | Hartung | |
| 2007/0258218 A1* | 11/2007 | Peng et al. | 361/715 |

FOREIGN PATENT DOCUMENTS

| | | |
|---|---|---|
| FR | 2886509 A1 | 12/2006 |
| GB | 2145290 A | 3/1985 |
| JP | 2002366259 A * | 12/2002 |
| WO | 2005032230 A | 4/2005 |

OTHER PUBLICATIONS

U.S. Appl. No. 11/915,372, filed Apr. 24, 2006 Not Yet Published (Inventor: Gerard Nemoz).

U.S. Appl. No. 12/438,417, filed Aug. 27, 2007 Not Yet Published (Inventor: Gerard Nemoz).

U.S. Appl. No. 12/334,742, filed Dec. 15, 2008 Not Yet Published (Inventor(s): Marc Gatti et al.).

U.S. Appl. No. 12/365,433, filed Feb. 4, 2009 Not Yet Published (Inventor: Gerard Nemoz).

U.S. Appl. No. 12/415,074, filed Mar. 31, 2009 Not Yet Published (Inventor: Gerard Nemoz).

* cited by examiner

US 8,542,485 B2

ELECTRONIC EQUIPMENT HOUSING COOLED BY NATURAL AND FORCED VENTILATION

CROSS-REFERENCE TO RELATED APPLICATIONS

The present Application is based on International Application No. PCT/EP2007/063700, filed on Dec. 11, 2007, which in turn corresponds to French Application No. 06 11209 filed on Dec. 21, 2006, and priority is hereby claimed under 35 USC § 119 based on these applications. Each of these applications are hereby incorporated by reference in their entirety into the present application.

FIELD OF THE INVENTION

The invention relates to the cooling of electronic equipment housed in housings or bays placed on accommodating platforms having a forced circulation of cooling air that can be subject to malfunctions. It relates notably to the electronic equipment housings or bays on board aircraft.

TECHNICAL BACKGROUND

The cooling of an electronic equipment unit in a housing is normally obtained by removing the calories produced inside the housing toward the external environment by means of an air stream, possibly pulsed, penetrating into the housing through ventilation orifices situated in the bottom part and serving as nozzles, coming into contact with the components of the electronic equipment and being removed in the top part of the housing through ventilation orifices serving as vents. The calorie removal capabilities increase with the cooling air flow rate. In the case of the aeronautical standards such as Arinc 600 notably, the diameter and the number of the ventilation orifices are constrained so as to observe a head loss for a standardized air flow rate, which is itself a function of the dissipated power. This constraint makes it possible to distribute the pulsed air stream between the various computers.

When an electronic equipment housing also serves as electromagnetic shielding, which is almost always the case for equipment on board an aircraft, the effectiveness of the electromagnetic shielding also imposes a reduced diameter on the ventilation holes.

These limitations on the diameter and on the number of the ventilation holes greatly restrict the cooling capabilities by natural convection and very often require the usable temperature range to be limited in the event of loss of the forced ventilation.

The electronic equipment units designed to be installed on board aircraft are usually placed in housings provided with ventilation orifices of a diameter and of a quantity that are insufficient to allow normal cooling solely by natural convection. These housings are placed on a pulsed air distribution box, a kind of organ windchest, distributing to them, through their ventilation orifices, a stream of pressurized cooling air conforming to precise specifications, for example those given in the ARINC 600 standard relating to the configuration of the housings and subracks used in aircraft to house replaceable electronic equipment units that are also said to be "rackable".

Such an arrangement poses the problem, critical when it comes to safety, of the necessary continuity of certain functions handled by the electronic equipment units in the event of loss of the pulsed cooling air stream.

Should the pulsed air stream be lost, the cooling is then provided only by a natural convection that is not very effective because of the excessively small useful section of the ventilation orifices that are limited in diameter and in quantity: in diameter by the requirements of the electromagnetic shielding and in quantity by the head loss imposed by the standard, and because of the external air volume available under the housings that is reduced through the content of the pulsed air distribution box. The temperature of the equipment units then increases significantly, which degrades their temperature operating margin.

Control of the operating temperature of an electronic equipment unit in the event of loss of the pulsed air stream is the main limitation encountered when seeking to reduce its bulk and to increase its functionalities by increasing the density of the electronic circuitry, because both are always accompanied by an increase in the production of calories by the liter.

To improve the cooling of an electronic equipment housing with cooling by pulsed air in the event of loss of the forced ventilation and allow for an increase in the compactness and the integration density of the electronic equipment, the applicant has already proposed, in a French patent application filed on Aug. 30, 2006 under the number 06 07628, providing an electronic equipment housing with orifices for ventilation by natural convection on its bottom and top walls and internal manifolds for distributing pulsed air fed with air under pressure via a distribution box placed at the back and connected to a pressurized air circulation duct.

SUMMARY OF THE INVENTION

The aim of the present invention is to improve the cooling, by natural convection, of an electronic equipment housing given the limitations in diameter and in quantity on the possibilities of drilling natural ventilation orifices in its walls, by exploiting any forced ventilation provided by internal manifolds for distributing pulsed air.

Its subject is an electronic equipment housing with cooling by natural and forced ventilation, comprising at least one internal thermal radiator cooled by natural and forced ventilation in thermal contact with one or more hot spots of electric equipment placed in the housing, at least one heat collector inserted between one or more hot spots and the internal thermal radiator(s), at least one external thermal radiator and at least one thermal conductor connecting, through the walls of the housing, the external thermal radiator(s) to one or more heat collectors.

Advantageously, the internal thermal radiator(s) are sized to be sufficient to cool the electric equipment placed in the housing when the forced ventilation is functioning normally whereas the external thermal radiator(s) are sized to complement the cooling provided by the internal thermal radiators should the forced ventilation be lost.

Advantageously, a portion of the air stream of the forced ventilation is directed to the external thermal radiator(s).

Advantageously, the forced ventilation is provided by means of internal manifolds for distributing pulsed air passing through the walls of the housing and arriving at the level of the external thermal radiator(s).

Advantageously, when the electronic equipment housing comprises flat removable modules arranged in a bay, side by side, on the edge, according to one or more alignments perpendicular to the back of the bay, the external thermal radiator(s) are fixed on the outside, on the front edges of the modules facing toward the front of the bay.

Advantageously, the forced ventilation of an external thermal radiator fixed to the edge of a module is obtained by means of a pulsed air distribution manifold inside the module extending through the front edge of the module.

Advantageously, when the electronic equipment housing comprises flat removable modules arranged in a bay, side by side, on the edge, according to one or more alignments perpendicular to the back of the bay, the external thermal radiator(s) are placed in one or more chimneys with natural and forced ventilation, fixed on the outside, on the front edges of the modules facing toward the front of the bay.

Advantageously, the forced ventilation of a chimney is obtained by means of a pulsed air distribution manifold inside the module extending through the front edge of the module to the base of the chimney.

Advantageously, the natural draft of a chimney is boosted by a Venturi effect obtained by means of the forced ventilation.

Advantageously, the forced ventilation of a chimney is obtained by means of a pulsed air distribution manifold inside the housing extending through the wall of the housing via a Venturi-effect nozzle penetrating into the base of the chimney and delivering a pulsed air stream boosting the natural circulation of the air within the chimney.

Advantageously, the natural ventilation of a chimney is boosted by a booster fan placed at the base of the chimney, against a partition isolating it from the forced ventilation air stream introduced into the chimney.

Advantageously, the natural ventilation of a chimney is boosted by a booster fan operated when a setpoint temperature is exceeded by the external thermal radiator(s) housed in the chimney.

Advantageously, the thermal conductor(s) are heat pipes.

Advantageously, the thermal conductor(s) are carbon-based rods with high thermal conductivity in the longitudinal direction.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
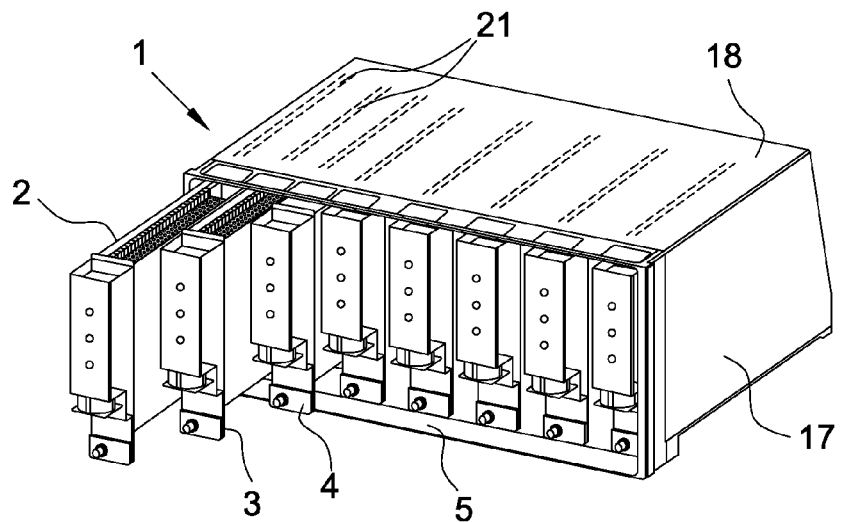
FIG. 1 is a view, in front lateral perspective, of an electronic bay for aircraft, conforming to the invention, shown with rackable electronic modules or units more or less inserted into their respective recesses.

The electronic bay (electric equipment housing) 1 which will be described is intended to contain a set of electronic modules 2, 3, 4, which are rackable because they can be plugged into a rack 5 of the bay 1 like drawers.

The rackable electronic modules 2, 3, 4 are somewhat flat and rectangular in form. They comprise a chassis frame 6 supporting a printed circuit card 7 with visible longitudinal edges constituting guiding longitudinal edges 8, 9, and two metal covers 10, 11 providing physical and electromagnetic protection for the printed circuit card 7 and its components.

The metal covers can be made up of printed circuit cards whose ground planes provide the shielding.

The printed circuit card 7 supports:
  on one of its faces or on both faces, electronic and/or optical components that are not visible in the figures, as well as wiring providing the electrical and/or optical interconnections for the components supported,
  on the component mounting face or faces, one or more finned internal thermal radiators 12, 13, 14 in close thermal contact with the electronic and/or optical components giving off calories and,
  on one of its faces or on both faces, a set of electrical 15 and/or optical 16 connectors dedicated to connecting the modules 2, 3, 4 together and to the environment outside the bay 1.

The electronic modules 2, 3, 4 can have other configurations provided that they observe the size constraints imposed by the bay 1. Notably, their guiding longitudinal edges 8, 9 can be offset with respect to the finned internal radiators 12, 13, 14 in thermal contact with the components giving off calories, in order to remove a portion of the calories from the chassis of the bay 1, or to one of the covers 10, 11.

The electronic bay 1 is provided with a metal rack 5 comprising, usually, lateral walls 17, a bottom wall that is not visible in the figures, a top wall 18 and a rear wall 19.

The bottom and top walls 18 of the bay 1 support, facing each other, two networks of parallel slideways oriented perpendicularly to the rear wall 19 and used to guide the longitudinal edges 8, 9 of the rackable modules 2, 3, 4 when inserting, extracting and securing the modules 2, 3, 4 side by side, on the edge, with their printed circuit cards 7 oriented in vertical planes perpendicular to the rear wall 19 of the bay 1.

The rear wall 19 of the bay 1 supports, in its top part, a set 20 of backplane connectors mating with the set or sets 15, 16 of connectors on the printed circuit cards 7 of the modules 2, 3, 4 to provide the connections for the modules 2, 3, 4 between themselves and with the environment outside the bay 1.

The fins of the internal thermal radiators 12, 13, 14 of the various modules 2, 3, 4 are oriented perpendicularly to the longitudinal edges of the modules 2, 3, 4 so as to be in the vertical position once the modules 2, 3, 4 are in place in the bay 1 and to facilitate the sweeping thereof by upward cooling air currents obtained by natural convection and by forced circulation.

The natural convection is due to the presence of ventilation orifices 21 in the bottom and top walls 18 of the bay 1.

The ventilation orifices 21 formed in the bottom and top walls 18 of the bay 1 are made up of holes of small diameter, of the order of 3 millimeters compatible with the electromagnetic shielding requirements of the bay 1. Those formed in an intermediate, bottom or top wall, provided to separate two module levels, are wide longitudinal slots because the continuity of the electromagnetic shielding of the bay 1 is not provided at this level, but at the level of the bottom or the cover of the bay 1.

The ventilation orifices 21 distributed over the entire surface area of the top wall 18 of the bay 1, and over the entire surface area of the bottom wall forming the true bottom of the bay 1, form screen-protected areas between the slideways of the networks supporting the modules 2, 3, 4 allowing a free circulation of the air with clearance spaces provided above and below the bay 1.

Figure 5:
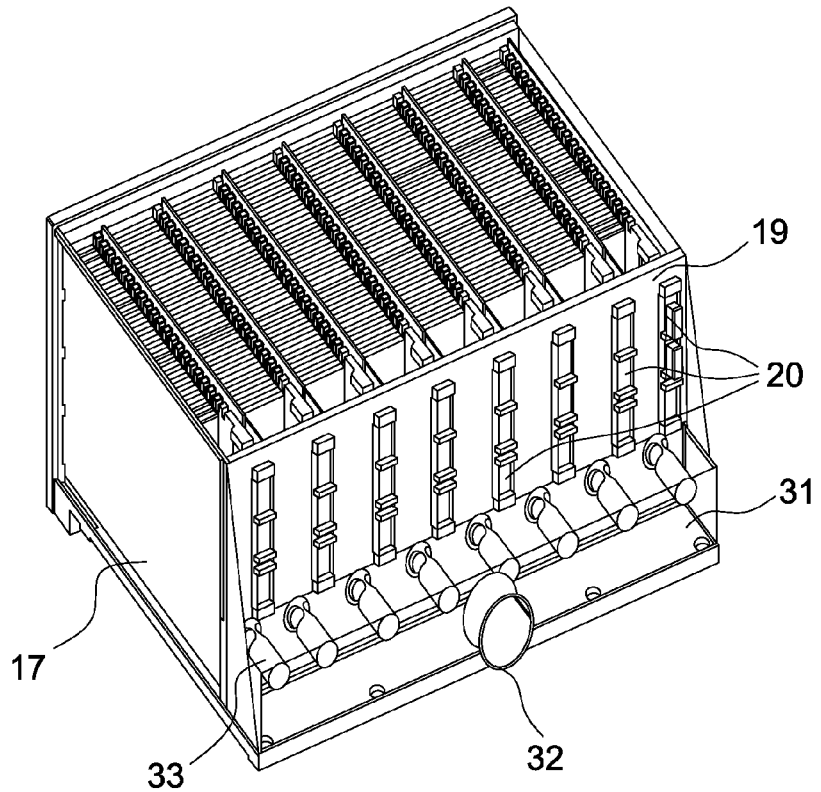
FIG. 5 is a rear lateral perspective view of the analog bay represented in FIG. 1, with top cover removed, illustrating the arrangement of a pulsed air distribution box.

In addition to the ventilation by natural convection, the fins of the internal thermal radiators of the modules 2, 3, 4 are subject to forced ventilation by means of pulsed air distribution manifolds 30 fed by a distribution box 31 (FIG. 5) fixed on the outside of the bay 1, in the bottom part of its rear wall 19, below the set of backplane connectors 20 and connected by a nozzle 32 to a pressurized air duct provided for the bay 1.

The pulsed air distribution manifolds 30 take the form of small "piccolo" flutes with obstructed bellmouth, with the playing holes serving as lateral vents. They are arranged horizontally, at the base of the modules 2, 3, 4 all along the finned internal thermal radiators 12, 13, 14, perpendicularly to the rear wall 19 of the bay 1, with individual nozzles 33 fitted into pulsed air distribution orifices of the distribution box 31 that can be accessed from the interior of the bay 1 through the rear wall 19, and with their lateral vents blowing the cooling air between the fins of the internal thermal radiators 12, 13, 14 of the modules 2, 3, 4.

Figure 3:
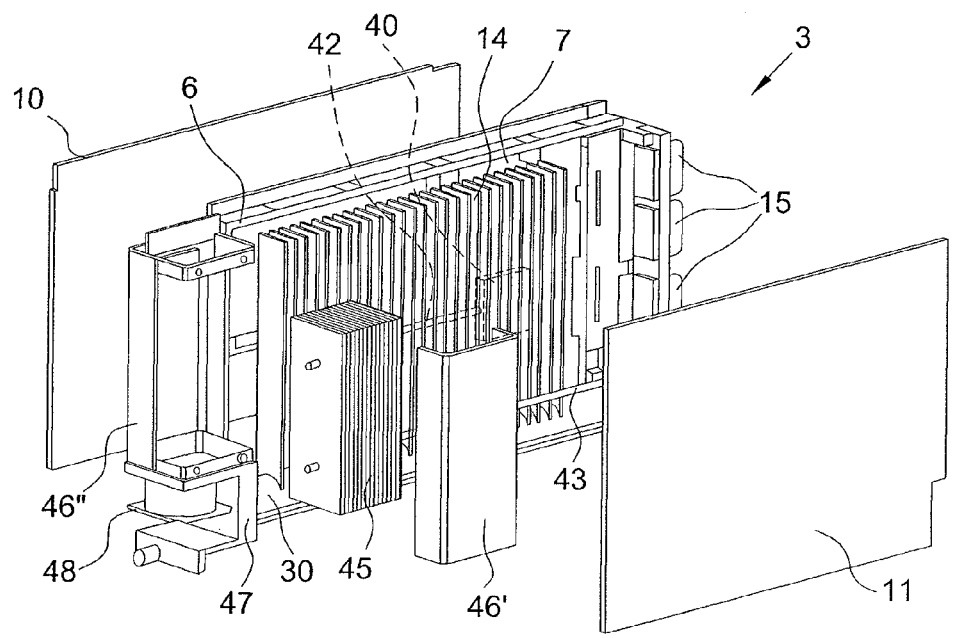
FIG. 3 is an exploded view, in front lateral perspective, showing the main elements that make up a module of the bay of FIG. 1.

As shown in FIG. 3, the pulsed air distribution manifolds 30 are fixed to the finned internal thermal radiators 12, 13, 14 of the modules 2, 3, 4 in grooves hollowed out perpendicularly to the fins, close to their bases. Their lateral vents, not visible in the figures, face toward the bottoms of the slots separating the fins, with a slight offset upward to prime and maintain upward air currents. Preferably, the pulsed air distribution manifolds 30 are spaced apart from the bottom of the grooves 34 so as not to present an obstacle to the upward air currents resulting from the natural convection, a boosting, by Venturi effect, of these upward air currents even being sought by an appropriate orientation of the vents of the manifolds 30.

The components mounted on the printed circuit card 7 that give off the most calories, for example the microprocessor chips, are placed in contact with the finned internal thermal radiators 12, 13, 14 via heat collectors 40, 41 connected to thermal conductors 42, 43, for example heat pipes or carbon-based rods with high thermal conductivity in the longitudinal direction, passing through the front wall 44 of the chassis frame 6 of a module 2, 3, 4 and terminating at an external thermal radiator 45 placed in a chimney 46 fixed externally to the front edge of a module 2, 3, 4.

Figure 2:
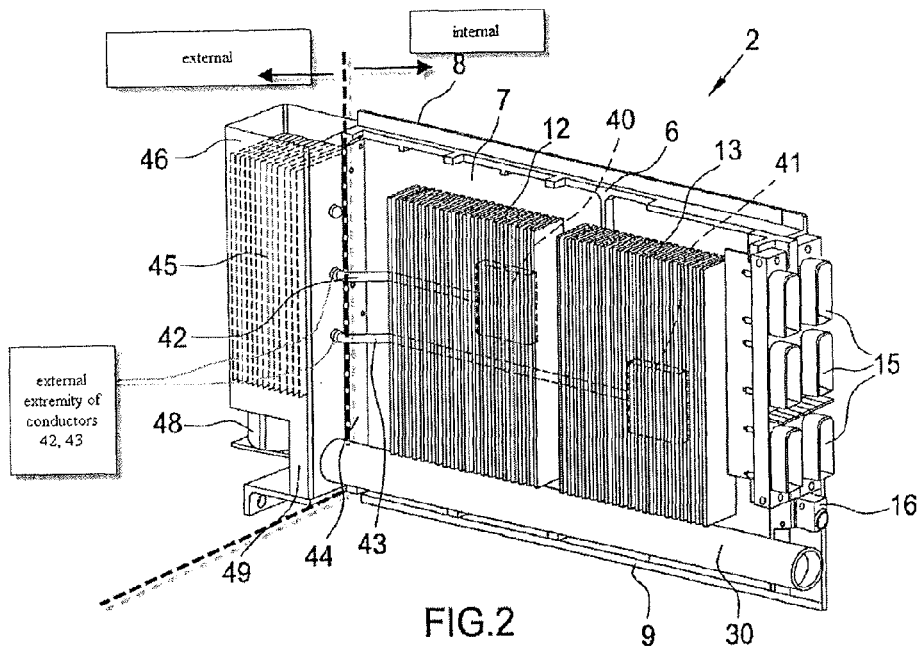
FIG. 2 is a view, in rear lateral perspective, of a module of the bay of FIG. 1, shown without its top cover.

As shown in FIGS. 2 and 3, the chimney 46 enclosing the external thermal radiator 45 has its walls made up of two half-shells 46', 46" mounted on collars that are fixed, like the external thermal radiator 45, to the front wall 44 of the chassis frame 6. The base of the chimney 46 rests on a support 47 for a fan 48 forming an intermediary chamber 49 between it and the front wall 44 of the chassis frame 6. This intermediary chamber 49 opens out into the base of the chimney 46 while being isolated from the fan 48. The pulsed air distribution manifold 30 providing the forced ventilation for the finned internal thermal radiators 12, 13, 14 passes at its end through the front wall of the chassis frame 6 to arrive inside the intermediary chamber 49 and insufflate, at the base of the chimney 46, through a nozzle or vent, a pulsed air current that uses Venturi effect to boost the natural air current originating, when the fan 48 is not running, from the space left free between the blades of the latter.

Figure 4:
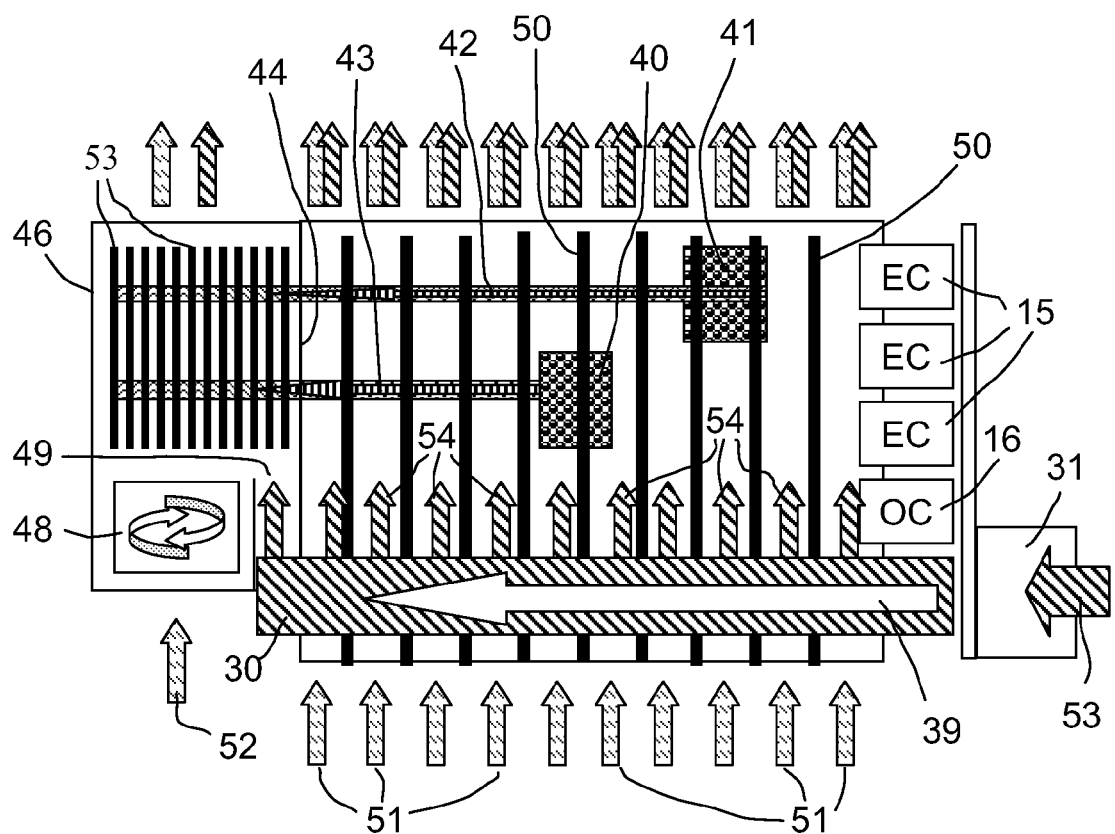
FIG. 4 is a diagrammatic view of a module of the bay of FIG. 1, represented in profile, according to a vertical cross section, detailing the paths of the cooling air streams at the level of a module.

FIG. 4 illustrates the distribution of the cooling air currents resulting from the natural convection and from the pulsed air distribution along the various thermal radiators of a module 2, 3, 4.

The natural convection provokes a sheet of upward cooling air currents identified by arrows 51, distributed along the fins 50 of the internal thermal radiators 12, 13, 14, and an upward air current identified by an arrow 52, circulating in the external chimney 46 along the fins 53 of the external thermal radiator 45.

The upward air currents 51 cooling the internal thermal radiators 12, 13, 14 due to natural convection, originate from the clearance space provided under the bay 1 through multiple ventilation orifices formed in the bottom of the bay 1 and possibly in the bottom intermediate walls providing separations between levels, and are removed toward the clearance space provided above the bay 1 through multiple ventilation orifices 21 formed in the top wall 11 of the bay 1 and possibly in top intermediate walls providing the separations between levels.

The upward air current 52 cooling the external thermal radiator 45 due to natural convection originates from the space left free between the blades of the fan 48, travels inside the chimney 46 in contact with the fins 53 of the external thermal radiator 45 and is vented through the top of the chimney 46 to the front of the bay 1.

The pulsed air distribution from a duct connected from the outside of the bay 1 to the distribution box 31, recalled in FIG. 4 by the arrow 53, provokes an additional sheet of upward air currents identified by arrows 54, which are obtained from the lateral vents of the distribution manifold 30, which is itself passed through, in the direction of the arrow 39, by the pulsed air vented from the distribution box 31, and which are distributed along the fins 50 of the internal thermal radiators 12, 13, 14. It also provokes, because of the end vent of the distribution manifold 30 situated in the intermediary chamber 49, an increase in the draft of the chimney 46.

The internal thermal radiators 12, 13, 14 are sized to be sufficient to cool the electric equipment placed in a module 2, 3, 4 when the forced ventilation is functioning normally. The external thermal radiator 45 is sized to complement the cooling provided by the internal radiators should the forced ventilation be lost. The fan 48 is tripped by a thermostat if a setpoint temperature taken on the card 7 or on the components of the card 7 is exceeded.

Various configuration variants can be envisaged. The manifolds 30 can be separated from the fins of the internal thermal radiators or from the chassis frame of the modules and have their own mounting supports, for example clips fixed to the bottom wall of the bay 1 between the slideways. They can even be joined to the distribution box 31. Their lateral vents can take various forms, including slots. The chimneys containing the thermal radiators external to the modules can form a whole with the fins of these radiators when the latter are not likely to reach temperatures that are dangerous to operators.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An electronic equipment housing adapted to be cooled by natural air ventilation and by forced air ventilation owing to ventilation holes of walls of the housing, using pulsed air, said housing comprising:
   at least one internal thermal radiator adapted to be cooled by natural and forced air ventilation and in thermal contact with one or more hot spots of an electric equipment located inside the housing;
   at least one heat collector for said at least one internal thermal radiator in thermal contact with said one or more hot spots;
   at least one external thermal radiator;
   at least one thermal conductor connected to said at least one heat collector, passing through one of the walls of the housing, and leading to the corresponding external thermal radiator; and
   removable modules arranged side by side in a direction parallel to a back wall of the housing,
   wherein the at least one external thermal radiator is placed in one or more corresponding chimneys with natural and forced air ventilation and fixed, outside of the housing, to the wall through which the at least one thermal conductor passes and which defines front edges of the modules.

2. The housing as claimed in claim 1, wherein the at least one internal thermal radiator is sized to cool the electric equipment when the forced air ventilation is functioning normally, and
   wherein the at least one external thermal radiator is sized to complement the cooling provided by the internal radiator should the forced ventilation be lost.

3. The housing as claimed in claim 1, wherein a portion of an air stream of the forced air ventilation is adapted to be directed to the at least one external thermal radiator.

4. The housing as claimed in claim 1, further comprising at least one internal manifold for distributing pulsed air coming through walls thereof to the at least one external thermal radiator.

5. The housing as claimed in claim 1, wherein one of the removable modules comprises at least one internal manifold for distributing pulsed air extending through the wall of the module and providing the forced air ventilation for various internal and external thermal radiators.

6. The housing as claimed in claim 1, wherein one of the removable modules with an external chimney comprises an internal manifold for distributing pulsed air extending through the wall of the module, ensuring the forced air ventilation of the internal thermal radiators and boosting a draft of the external chimney.

7. The housing as claimed in claim 1, wherein one of the removable modules with an external chimney comprises a booster fan arranged at a base of the chimney.

8. The housing as claimed in claim 7, wherein the booster fan arranged at the base of the chimney is configured to operate when said one or more external thermal radiators housed in the chimney exceeds a setpoint temperature.

9. The housing as claimed in claim 6, wherein one of the removable modules with an external chimney comprises, at a base of the chimney, a booster fan separated by a partition, from an intermediary chamber in communication with the chimney, into which opens the internal manifold for distributing pulsed air.

10. The housing as claimed in claim 1, wherein the thermal conductor includes heat pipes.

11. The housing as claimed in claim 1, wherein the thermal conductor includes carbon-based rods with high thermal conductivity in a longitudinal direction thereof.

* * * * *